US012785619B2

(12) United States Patent
Huang et al.

(10) Patent No.: US 12,785,619 B2

(45) Date of Patent: Nov. 3, 2026

(54) TEMPERATURE CONTROL APPARATUS AND RELATED DEVICE

(71) Applicant: Huawei Technologies Co., Ltd., Shenzhen (CN)

(72) Inventors: Linhai Huang, Shenzhen (CN); Fengpei Sun, Shenzhen (CN); Zhihong Feng, Wuhan (CN); Jinghui Xu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 19/027,767

(22) Filed: Jan. 17, 2025

(65) Prior Publication Data

US 2025/0167731 A1 May 22, 2025

Related U.S. Application Data

(63) Continuation of application No. PCT/CN2023/098306, filed on Jun. 5, 2023.

(30) Foreign Application Priority Data

Jul. 30, 2022 (CN) ........................ 202210912613.7

(51) Int. Cl.
*H03B 5/04* (2006.01)
*H03B 5/30* (2006.01)
(Continued)

(52) U.S. Cl.
CPC ................ *H03B 5/04* (2013.01); *H03B 5/30* (2013.01); *H03H 9/02338* (2013.01);
(Continued)

(58) Field of Classification Search
CPC ................ H03H 9/02448; H03H 9/08; H03H 9/02102; H03H 9/0542; H03H 2009/2442;
(Continued)

(56) References Cited

U.S. PATENT DOCUMENTS

| | | | | |
|---|---|---|---|---|
| 10,425,084 | B2 | 9/2019 | Kaajakari | |
| 2015/0214956 | A1 | 7/2015 | Hsieh et al. | |
| 2018/0019754 | A1* | 1/2018 | Kaajakari | ................ H03H 9/02 |

FOREIGN PATENT DOCUMENTS

| | | | |
|---|---|---|---|
| CN | 104811138 | A | 7/2015 |
| CN | 109195904 | A | 1/2019 |
| CN | 113639735 | A | 11/2021 |
| CN | 216751694 | U | 6/2022 |
| WO | 2019070315 | A1 | 4/2019 |

OTHER PUBLICATIONS

Jia, Wenhan, et al. "A micro-oven-controlled dual-mode piezoelectric MEMS resonator with±400 PPB stability over—40 to 80° C temperature range." IEEE Transactions on Electron Devices 69.5 (May 2022): 2597-2603. (Year: 2022).*

(Continued)

*Primary Examiner* — Ryan Johnson

(74) *Attorney, Agent, or Firm* — Conley Rose, P.C.

(57) ABSTRACT

A temperature control apparatus includes a first fastening structure, a second fastening structure, two first support beams, two second support beams, a fastening frame, and a target component. The first fastening structure and the target component are located on an inner side of the fastening frame. The second fastening structure is located on an outer side of the fastening frame. The first fastening structure is connected to the fastening frame through the two first support beams. The second fastening structure is connected to the fastening frame through the two second support beams. The target component is fastened to the first fastening structure. A temperature difference between a first con- (Continued)

nection position and a second connection position that are on the fastening frame and that are respectively for connection to the two first support beams is less than a first preset value.

20 Claims, 14 Drawing Sheets

(51) Int. Cl.
*H03H 9/02* (2006.01)
*H03H 9/08* (2006.01)

(52) U.S. Cl.
CPC .......... *H03H 9/02448* (2013.01); *H03H 9/08* (2013.01); *H03H 2009/02385* (2013.01)

(58) Field of Classification Search
CPC .......... H03H 9/2405; H03B 5/04; H03B 5/30; H03L 1/04; H03L 1/02; H03L 1/022
See application file for complete search history.

(56) References Cited

OTHER PUBLICATIONS

Samira Zaliasl et al, "A 3 ppm 1.5 × 0.8 $mm^2$ 1.0 µA 32.768 kHz MEMS-Based Oscillator", IEEE Journal of Solid-State Circuits, vol. 50, No. I, Jan. 2015, XP011568757, total 12 pages.
Salvia, J.C et al,"Real-Time Temperature Compensation of MEMS Oscillators Using an Integrated Micro-Oven and a Phase-Locked Loop," Journal of Microelectromechanical Systems, vol. 19, No. 1, Feb. 2010, total 10 pages.
Chen, Yunhan et al,"In-Situ Ovenization of Lamé-Mode Silicon Resonators for Temperature Compensation," MEMS 2015, Estoril, Portugal, Jan. 18-22, 2015, total 4 pages.
Chen, Y et al, "Ovenized dual-mode clock (ODMC) based on highly doped single crystal silicon resonators," MEMS 2016, Shanghai, China, Jan. 24-28, 2016, total 4 pages.

* cited by examiner

TEMPERATURE CONTROL APPARATUS AND RELATED DEVICE

CROSS-REFERENCE TO RELATED APPLICATIONS

This is a continuation of Int'l Patent App. No. PCT/CN2023/098306, filed on Jun. 5, 2023, which claims priority to Chinese Patent App. No. 202210912613.7, filed on Jul. 30, 2022, which are incorporated by reference.

TECHNICAL FIELD

This disclosure relates to the field of temperature control structures, and in particular, to a temperature control apparatus and a related device.

BACKGROUND

Micro-electro-mechanical system (MEMS) components are a type of micro-component that is manufactured based on a semiconductor micro-processing technology and that has a movable mechanical structure and can implement mutual conversion between mechanical motion and an electrical signal, and have advantages of a small size, easy integration, low power consumption, high sensitivity, a low price, and the like. The MEMS components are widely used in fields of sensors, wireless communication, intelligent systems, and the like, such as MEMS gyroscopes, MEMS accelerometers, MEMS micro-mirrors, and MEMS oscillators. As a new type of clock component, the MEMS oscillators are gradually replacing crystal oscillators in fields of mobile phones, automobiles, wireless communication, and the like.

Oven-controlled MEMS oscillators (OCMOs) are a type of MEMS oscillator used in scenarios requiring high output frequency precision. The OCMO includes a MEMS resonator, a temperature sensor, a heater, and a feedback circuit. The MEMS resonator generates a periodic clock signal through mechanical oscillation. The temperature sensor captures a temperature of the MEMS resonator in real time. Then, the feedback circuit controls power of the heater, to stabilize the temperature of the resonator at a constant value, so as to suppress frequency drift of the resonator resulting from temperature drift.

Currently, a mainstream temperature measurement solution of the OCMO is to measure a temperature based on a modal frequency of the resonator or by using a resistance value as a temperature measurement indicator. However, in the existing solution, these temperature measurement indicators are susceptible to interference caused by ambient temperature fluctuation, and it is difficult to truly reflect the temperature of the MEMS resonator, resulting in low temperature measurement precision.

SUMMARY

Embodiments of this disclosure provide a temperature control apparatus and a related device, so that impact of ambient temperature fluctuation on an internal component can be effectively suppressed, and temperature measurement precision can be improved.

According to a first aspect, embodiments of this disclosure provide a temperature control apparatus. The temperature control apparatus includes a first fastening structure, a second fastening structure, two first support beams, two second support beams, a fastening frame, and a target component. The first fastening structure and the target component are located on an inner side of the fastening frame. The second fastening structure is located on an outer side of the fastening frame. The first fastening structure is connected to the fastening frame through the two first support beams. The second fastening structure is connected to the fastening frame through the two second support beams. The target component is fastened to the first fastening structure. A temperature difference between a first connection position and a second connection position that are on the fastening frame and that are respectively for connection to the two first support beams is less than a first preset value.

In this implementation, a double-layer structure design is provided to isolate the target component from an external environment, so as to achieve better thermal isolation effect. The fastening frame located at an outer layer is directly in contact with the external environment, and temperature gradient distribution introduced by the external environment mainly exists on the fastening frame. The fastening structure located at an inner layer is connected to the fastening frame through the two support beams. The temperature difference between the two positions that are on the fastening frame and that are respectively for connection to the two support beams is less than the first preset value. In an implementation, temperatures of the two positions are completely equal. In other words, the fastening structure is connected to the two isothermal positions on the fastening frame. Therefore, the fastening structure is heated more uniformly. In this way, the fastening structure and the target component connected to the fastening structure can maintain relatively balanced temperatures, and impact of external ambient temperature fluctuation on the target component is reduced, so that temperature measurement precision is improved.

In some possible implementations, a third connection position and a fourth connection position on the fastening frame are respectively for connection to the two second support beams. The fastening frame includes a first sub-area, a second sub-area, a third sub-area, and a fourth sub-area. The first sub-area is located between the first connection position and the third connection position. The second sub-area is located between the second connection position and the third connection position. The third sub-area is located between the first connection position and the fourth connection position. The fourth sub-area is located between the second connection position and the fourth connection position. A ratio of a thermal resistance of the first sub-area to a thermal resistance of the third sub-area is a first ratio. A ratio of a thermal resistance of the second sub-area to a thermal resistance of the fourth sub-area is a second ratio. A difference between the first ratio and the second ratio is less than a second preset value. If this condition is met, it can be ensured that the temperature difference between the first connection position and the second connection position is less than the first preset value. In an implementation, the first ratio is equal to the second ratio, to ensure that the temperatures of the first connection position and the second connection position are completely equal. In this implementation, a specific implementation of determining the isothermal positions on the fastening frame is provided, which further ensures that the target component is not affected by external ambient temperature fluctuation.

In some possible implementations, the temperature control apparatus further includes a temperature adjustment element. The temperature adjustment element is configured to adjust temperatures of the fastening frame, the first fastening structure, and the target component. In this implementation, the temperature adjustment element actively adjusts the temperature, so that the target component can work in a specified temperature environment, to facilitate implementation of a specific function. For example, the target component is a resonator. Through temperature control, the resonator may output a clock signal at a stable frequency.

In some possible implementations, the temperature adjustment element is located on the second support beam, and a thermally conductive insulation layer is disposed between the temperature adjustment element and the second support beam; and/or the temperature adjustment element is located on the first support beam, and a thermally conductive insulation layer is disposed between the temperature adjustment element and the first support beam. In this implementation, a plurality of design positions of the temperature adjustment element is provided, which improves flexibility of this solution. In addition, the thermally conductive insulation layer is added, and a downward heat dissipation channel is provided, which increases an effective thermal conductivity coefficient, and improves the heating temperature resolution. In addition, using an example in which the temperature adjustment element is a heating resistor, a multi-layer structure design allows the heating resistor to be excessively thin and a resistance value to be excessively large when it is ensured that structural rigidity remains unchanged. In this solution, power consumption can be reduced under a same temperature rise.

In some possible implementations, a first voltage is loaded on the temperature adjustment element to perform heating, a second voltage loaded on the first support beam and/or the second support beam is conducted to the target component, and the first voltage is electrically isolated from the second voltage. In this implementation, the thermally conductive insulation layer may implement heat conduction but is electrically isolated. Therefore, on the basis of ensuring that a temperature adjustment function is normal, a heating voltage loaded on the temperature adjustment element is separated from the voltage loaded on the target component, so that heating voltage resolution can be improved, to implement higher heating temperature resolution without affecting a function of the target component.

In some possible implementations, the temperature control apparatus further includes a temperature measurement element. The temperature measurement element is located on the inner side of the fastening frame and is fastened to the first fastening structure. The temperature measurement element is configured to detect a temperature of the target component. In this implementation, the temperature of the target component may be detected by using the temperature measurement element, to monitor a temperature change of the target component in real time.

In some possible implementations, the target component is a first resonator, and the first resonator includes a clock working mode and a temperature measurement working mode. When the first resonator is in the clock working mode and a temperature of the first resonator is within a target range, the first resonator outputs a clock signal at a stable frequency. When the first resonator is in the temperature measurement working mode, a temperature measurement signal output by the first resonator indicates a temperature of the first resonator. In this implementation, the first resonator may work in both the clock working mode and the temperature measurement working mode, and feed back the temperature by using the signal output in the temperature measurement working mode, so that the temperature of the first resonator is within the target range through temperature control, to output the clock signal at a stable frequency in the clock working mode. Temperature feedback and clock signal output are implemented by using characteristics of the resonator, and the temperature measurement element does not need to be disposed, which shows better practical effect.

In some possible implementations, the temperature control apparatus further includes a second resonator, and the second resonator is located on the inner side of the fastening frame and is fastened to the first fastening structure. The first resonator is in the clock working mode, and the second resonator is in the temperature measurement working mode; or the first resonator is in the temperature measurement working mode, and the second resonator is in the clock working mode. In this implementation, the two resonators may alternatively be disposed. The two resonators are in different working modes, to implement temperature feedback and clock signal output through cooperation, which enhances expansibility of this solution.

In some possible implementations, types of the first resonator include a MEMS resonator, a crystal resonator, and a crystal MEMS resonator, which expands application scenarios of this solution.

In some possible implementations, the second support beam includes a connection beam and a connection frame. The fastening frame is located on an inner side of the connection frame and is connected to the connection frame. One end of the connection beam is connected to the second fastening structure. The other end of the connection beam is connected to the connection frame. A temperature difference between two connection positions that are on the connection frame and that are for connection to the fastening frame is less than the first preset value. In this implementation, the connection frame may be considered as an outer layer structure, the fastening frame may be considered as an intermediate layer structure, and the fastening structure may be considered as an inner layer structure, to form a three-layer thermal isolation structure, which has better thermal isolation effect.

In some possible implementations, the first fastening structure is a frame structure, so that stability of the structure is better.

In some possible implementations, the temperature control apparatus further includes a substrate layer. The second fastening structure is fastened to the substrate layer, and the fastening frame, the first fastening structure, and the target component are suspended on the substrate layer. In this implementation, a specific implementation of processing and fastening the temperature control apparatus is provided, which improves practicability of this solution.

In some possible implementations, the temperature control apparatus further includes a substrate layer and a base. A partial structure of each of the first fastening structure, the second fastening structure, and the fastening frame is located at the substrate layer, the second fastening structure is fastened to the base, and the fastening frame, the first fastening structure, and the target component are suspended on the base. In this implementation, another specific implementation of processing and fastening the temperature control apparatus is provided, which extends application scenarios of this solution.

According to a second aspect, an embodiment of this disclosure provides a temperature-compensated oscillator. The temperature-compensated oscillator includes a temperature compensation module and the temperature control apparatus described in any one of the implementations of the first aspect. A target component in the temperature control apparatus is a resonator. Specifically, the resonator is configured to output an original clock signal to the temperature compensation module. The temperature compensation module is configured to obtain a temperature of the resonator, and adjust the original clock signal based on the temperature to obtain a target clock signal at a stable frequency.

In some possible implementations, the resonator is further configured to output a temperature measurement signal to the temperature compensation module. The temperature compensation module is further configured to obtain the temperature of the resonator based on the temperature measurement signal.

In some possible implementations, the temperature control apparatus includes a temperature measurement element. The temperature measurement element is configured to detect the temperature of the resonator. The temperature compensation module is further configured to obtain the temperature of the resonator by using the temperature measurement element.

According to a third aspect, an embodiment of this disclosure provides an oven-controlled oscillator. The oven-controlled oscillator includes a controller and the temperature control apparatus described in any one of the implementations of the first aspect. A target component in the temperature control apparatus is a resonator, and the temperature control apparatus includes a temperature adjustment element. Specifically, the controller is configured to obtain an original temperature of the resonator, and control the temperature adjustment element based on the original temperature to adjust the original temperature to a target temperature. When the first resonator is in a clock working mode and the first resonator is at the target temperature, the first resonator outputs a clock signal at a stable frequency.

In some possible implementations, the resonator is configured to output a temperature measurement signal to the controller. The controller is further configured to obtain the original temperature of the resonator based on the temperature measurement signal.

In some possible implementations, the temperature control apparatus includes a temperature measurement element, and the temperature measurement element is configured to detect the original temperature of the resonator. The controller is further configured to obtain the original temperature of the resonator by using the temperature measurement element.

In embodiments of this disclosure, a double-layer structure design is provided to isolate a target component from an external environment, so as to achieve better thermal isolation effect. A fastening frame located at an outer layer is directly in contact with the external environment, and temperature gradient distribution introduced by the external environment mainly exists on the fastening frame. A fastening structure located at an inner layer is connected to the fastening frame through two support beams. A temperature difference between two positions that are on the fastening frame and that are respectively for connection to the two support beams is less than a first preset value. In other words, the fastening structure is connected to the two isothermal positions on the fastening frame. Therefore, the fastening structure is heated more uniformly. In this way, the fastening structure and the target component connected to the fastening structure can maintain relatively balanced temperatures, and impact of external ambient temperature fluctuation on the target component is reduced, so that temperature measurement precision is improved.

DESCRIPTION OF EMBODIMENTS

Embodiments of this application provide a temperature control apparatus and a related device, so that impact of ambient temperature fluctuation on an internal component can be effectively suppressed, and temperature measurement precision can be improved. In the specification, claims, and accompanying drawings of this application, the terms "first", "second", and so on (if any) are intended to distinguish between similar objects but do not necessarily indicate a specific order or sequence. It should be understood that data termed in such a way are interchangeable in proper circumstances so that embodiments of the present disclosure described herein can be implemented in orders other than the order illustrated or described herein. In addition, the terms "include", "have", and any other variant thereof are intended to cover a non-exclusive inclusion. For example, a process, method, system, product, or device that includes a list of steps or units is not necessarily limited to those steps or units that are expressly listed, but may include other steps or units that are not expressly listed or are inherent to the process, method, system, product, or device.

Figure 1:
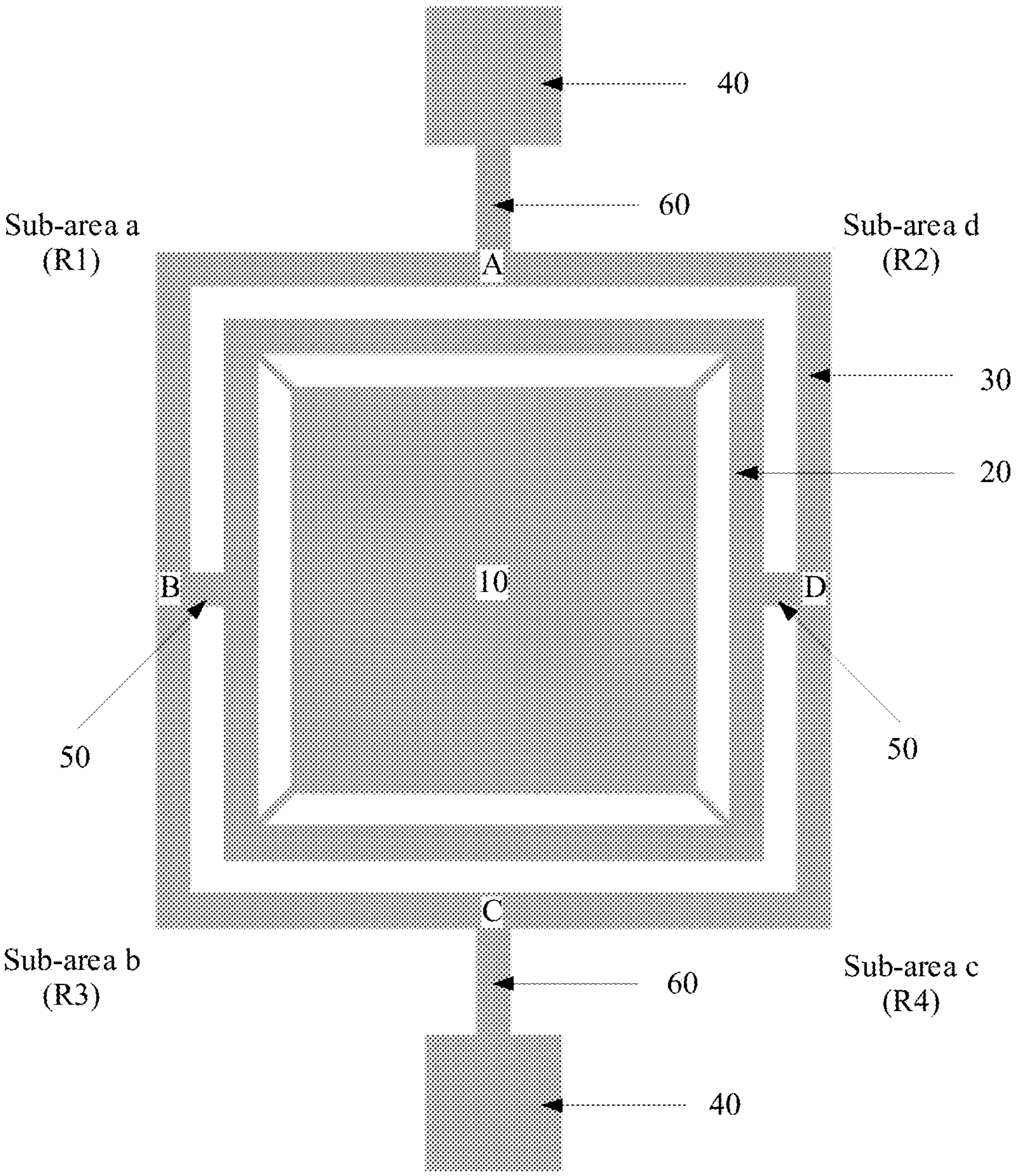
FIG. 1 is a first diagram of a structure of a temperature control apparatus according to an embodiment.

FIG. 1 is a first diagram of a structure of a temperature control apparatus according to an embodiment of this application. As shown in FIG. 1, the temperature control apparatus includes a target component 10, a fastening structure 20, a fastening frame 30, a fastening structure 40, a support beam 50, and a support beam 60. It should be understood that the fastening frame 30 is a hollow closed structure, and a specific shape of the fastening frame 30 is not limited in this application. The fastening structure 20 and the target component 10 are located on an inner side of the fastening frame 30, and the fastening structure 40 is located on an outer side of the fastening frame 30. The fastening structure 20 is connected to the fastening frame 30 through two support beams 50, and the fastening structure 40 is connected to the fastening frame 30 through two support beams 60. The target component 10 is fastened to the fastening structure 20.

It should be noted that a specific implementation of the fastening structure 20 is not limited in this application. For example, the fastening structure 20 may be a frame structure shown in FIG. 1. For another example, the fastening structure 20 may include two independent anchor structures, and is a non-closed structure. The two anchor structures of the fastening structure 20 are respectively connected to the two support beams 50. For ease of illustration, in all the accompanying drawings including FIG. 1, an example in which the fastening structure 20 is a frame structure is used for presentation. Similar to the fastening structure 20, a specific implementation of the fastening structure 40 is not limited in this application. For ease of illustration, in all the accompanying drawings including FIG. 1, an example in which the fastening structure 40 includes a plurality of anchor structures is used for presentation.

It should be further noted that a specific quantity of support beams 50 and a specific quantity of support beams 60 are not limited in this application. In some possible implementations, two support beams form a group, and a plurality of groups of support beams 50 and a plurality of groups of support beams 60 may be further disposed. In addition, specific implementations of the support beam 50 and the support beam 60 are also not limited in this application. For example, the support beam 50 and the support beam 60 may be straight beams or folded beams.

It should be further noted that a specific type of the target component 10 is not limited in this application. For example, the target component 10 may be a resonator, a gyroscope, an accelerometer, a micro-mirror, or the like. For ease of description, the following mainly uses an example in which the target component 10 is a resonator for description. Types of the resonator include but are not limited to a MEMS resonator, a crystal resonator, a crystal MEMS resonator, and the like.

In this application, to avoid impact of external ambient temperature fluctuation on the target component 10 to a greatest extent, a double-layer structure is designed to encircle the target component 10, so as to achieve thermal isolation effect. The fastening frame 30 may be considered as an outer layer structure, or may be briefly referred to as an "outer frame". The fastening structure 20 may be considered as an inner layer structure. If the fastening structure 20 is also designed as a frame, the fastening structure 20 may be briefly referred to as an "inner frame". It should be understood that the fastening frame 30 is directly in contact with an external environment, and is affected by external ambient temperature fluctuation. Heat is transferred between the fastening frame 30 and the fastening structure 20 through the support beam 50. If a temperature difference between the two support beams 50 is large, heating uniformity on the fastening structure 20 and the target component 10 connected to the fastening structure 20 is also affected. Therefore, based on a double-layer structure design, in this application, two isothermal positions on the fastening frame 30 are selected to be connected to the support beams 50, so that the fastening structure 20 and the target component 10 are heated more uniformly, and impact of external ambient temperature fluctuation on the target component 10 is further reduced.

It should be noted that, in actual application, the fastening structure 40 is usually used as an anchor to fasten the entire temperature control apparatus. FIG. 1 is used as an example. Two fastening structures 40 that are used as anchors are directly in contact with an external structure. Parts other than the fastening structures 40 are in a suspended state and are not directly in contact with the external structure. Because temperature fluctuation of the external structure may cause different temperatures of the two fastening structures 40, the fastening frame 30 connected to the two fastening structures 40 is in a state of non-uniform heating. To ensure that the target component 10 is heated uniformly, the fastening structure 20 connected to the fastening frame 30 are heated uniformly first. Therefore, the two positions that are on the fastening frame 30 and that are for connection to the fastening structure 20 are isothermal positions.

Figure 2:
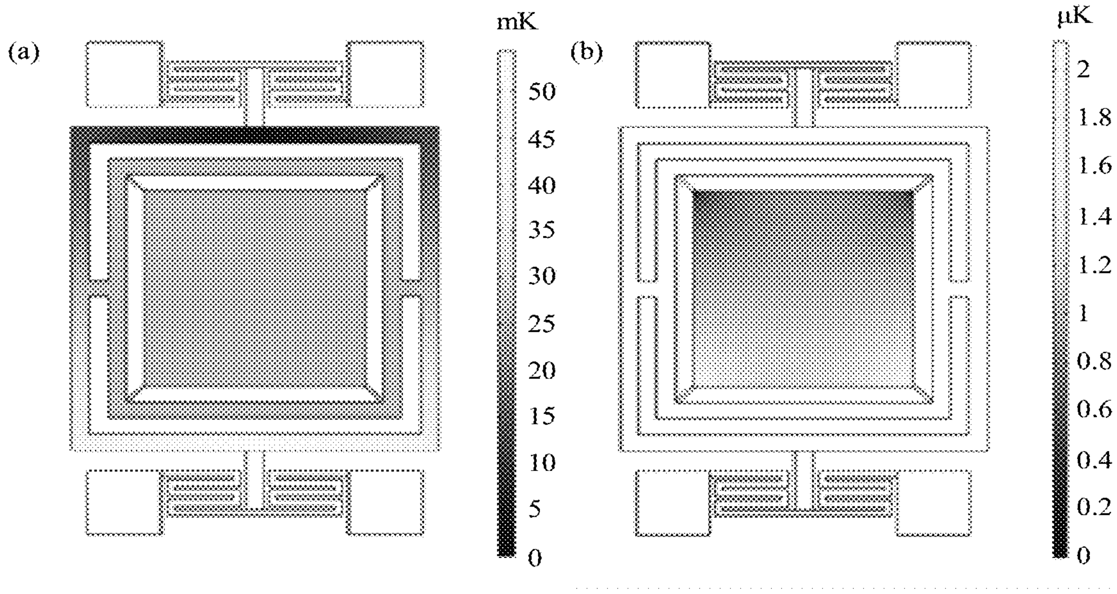
FIG. 2 is a diagram of temperature distribution of a temperature control apparatus according to an embodiment.

FIG. 2 is a diagram of temperature distribution of a temperature control apparatus according to an embodiment of this application. It should be understood that the temperature distribution shown in FIG. 2 is obtained under a condition that ambient temperature gradient distribution introduces a specific temperature difference to the two fastening structures 40. For example, the temperature difference may be 0.1 degree Celsius. As shown in (a) in FIG. 2, temperature distribution with a maximum temperature difference of approximately 50 millikelvins (mK) exists between the fastening frame 30 and the target component 10. As shown in (b) in FIG. 2, temperature distribution with a maximum temperature difference of approximately 2 microkelvins (μK) exists on the target component 10. It can be seen that temperature gradient distribution introduced by an external environment mainly exists on the fastening frame 30, and the target component 10 maintains a relatively balanced temperature, and is slightly affected by an external ambient temperature.

It should be understood that there is not only one group of isothermal positions on the fastening frame 30. FIG. 1 is used as an example. The fastening frame 30 is a rectangle, a connection position B is located at a central position of one side of the rectangle, a connection position D is located at a central position of another opposite side of the rectangle, and the connection position B and the connection position D are isothermal positions. In addition, on the basis of FIG. 1, the connection position B and the connection position D may be synchronously translated upward or synchronously translated downward, and the connection position B and the connection position D are still isothermal positions. Using the isothermal positions shown in FIG. 1 is more conducive to improving stability of the structure.

It should be further understood that each of the foregoing isothermal positions has a specific length. The connection position B in FIG. 1 is used as an example. The connection position B is located on one side of the fastening frame 30 and occupies a segment of length of the fastening frame 30, which is a length of the connection position B. As shown in FIG. 2, temperature distribution with a maximum temperature difference of approximately 50 mK exists on the side on which the connection position B is located. A shorter length of the connection position B indicates a smaller temperature distribution range of the connection position B, and is more conducive to ensuring that the fastening structure 20 and the target component 10 are heated uniformly. For example, the temperature distribution range of the connection position B may be controlled to be 1 mK. It should be noted that, although a shorter length of the connection position B is more conducive to reducing impact of external ambient temperature fluctuation on the target component 10, an excessively short length of the connection position B is not conducive to overall stability of the structure. Therefore, both factors may be considered to properly select the length of the connection position B. Similarly, the foregoing description is also applicable to the connection position D that is at a temperature equal to that of the connection position B.

It should be noted that, in actual application, temperatures of the foregoing two isothermal positions are not necessarily required to be completely equal. The two connection positions may be considered as isothermal positions provided that a temperature difference between the two connection positions is less than a first preset value. Each of the two connection positions has specific temperature distribution. Therefore, the temperature difference between the two connection positions may be a temperature difference between respective average temperatures of the two connection positions. In a possible implementation, the first preset value may be set with reference to temperature distribution ranges of the connection position B and the connection position D. For example, the temperature distribution ranges of the connection position B and the connection position D are both 1 mK, but temperatures of the two connection positions are not equal. If the temperature difference between the two connection positions is less than 1 mK, the two connection positions may be considered as isothermal positions. In an implementation, the temperatures of the two isothermal positions are completely equal.

The following describes a specific implementation of determining the isothermal positions.

In a possible implementation, four connection positions on the fastening frame 30 are for connection to the support beams 50 and the support beams 60, and the fastening frame 30 may be divided into four sub-areas by using the four connection positions as boundary points. If thermal resistances of the four areas meet a specified condition, two positions that are on the fastening frame 30 and that are for connection to the support beams 50 may be considered as isothermal positions, which is equivalent to providing a specific implementation of determining the isothermal positions. Specifically, FIG. 1 is used as an example. The four connection positions on the fastening frame 30 are denoted as a connection position A, the connection position B, a connection position C, and the connection position D, and the four sub-areas on the fastening frame 30 are denoted as a sub-area a, a sub-area b, a sub-area c, and a sub-area d. The sub-area a is located between the connection position A and the connection position B, the sub-area b is located between the connection position B and the connection position C, the sub-area c is located between the connection position C and the connection position D, and the sub-area d is located between the connection position D and the connection position A. If a thermal resistance of the sub-area a is denoted as R1, a thermal resistance of the sub-area b is denoted as R3, a thermal resistance of the sub-area c is denoted as R4, and a thermal resistance of the sub-area d is denoted as R2, the specified condition is that a difference between R1/R3 and R2/R4 is less than a second preset value. In an example, a typical range of R1/R3 and R2/R4 is ⅕ to 5. If the difference between R1/R3 and R2/R4 is less than 1/50, it may be considered that the specified condition is met, and the connection position B and the connection position D may be considered as isothermal positions. In an implementation, R1/R3=R2/R4, to ensure that the temperatures of the connection position B and the connection position D are completely equal.

Figure 3A:
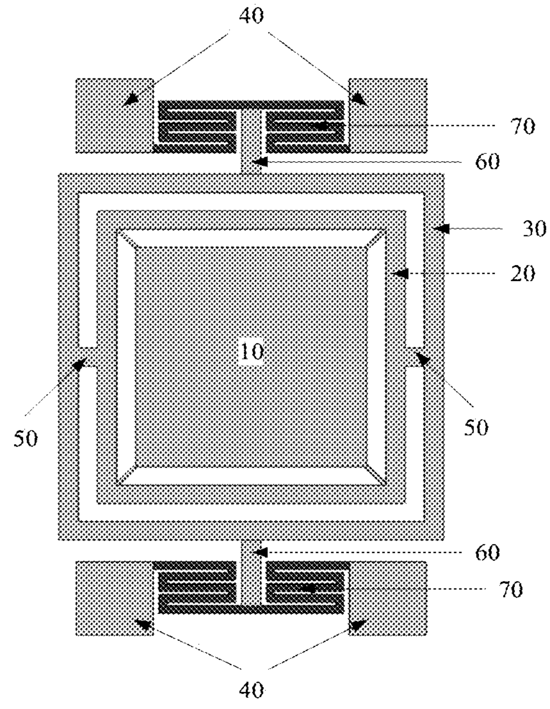
FIG. 3A is a second diagram of a structure of a temperature control apparatus according to an embodiment.
Figure 3B:
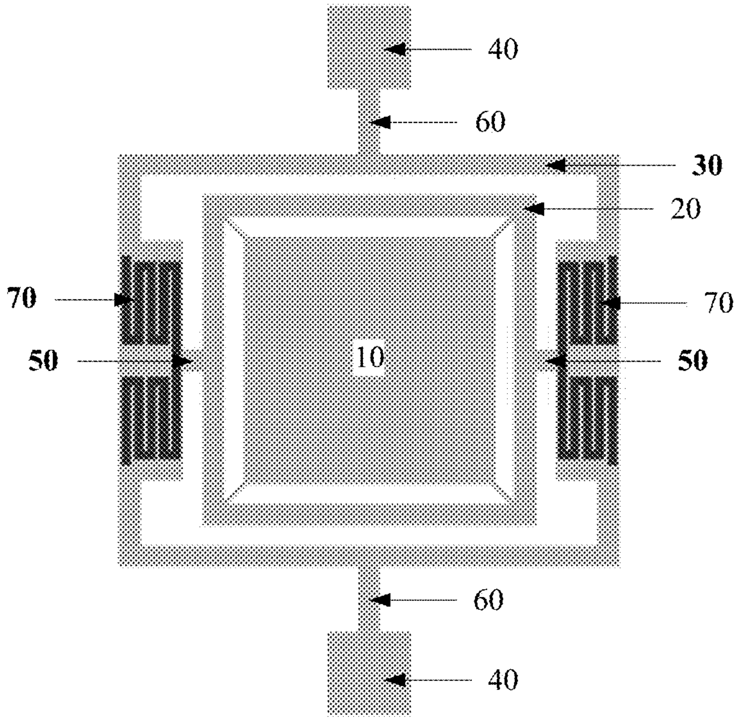
FIG. 3B is a third diagram of a structure of a temperature control apparatus according to an embodiment.

FIG. 3A is a second diagram of a structure of a temperature control apparatus according to an embodiment of this application. As shown in FIG. 3A, in some possible implementations, the temperature control apparatus may further include a temperature adjustment element 70. The temperature adjustment element may adjust temperatures of the fastening frame 30, the fastening structure 20, and the target component 10, to achieve temperature control effect. It should be understood that a specific type of the temperature adjustment element 70 is not limited in this application. The following mainly uses an example in which the temperature adjustment element 70 is a heating resistor for description. For example, the heating resistor may be disposed on the support beam 60 shown in FIG. 3A, and the heating resistor heats the support beam 60 to implement temperature adjustment on the fastening frame 30, the fastening structure 20, and the target component 10. FIG. 3B is a third diagram of a structure of a temperature control apparatus according to an embodiment of this application. As shown in FIG. 3B, the temperature adjustment element 70 may alternatively be disposed on the support beam 50, and the temperature adjustment element 70 heats the support beam 50 to implement temperature adjustment on the fastening frame 30, the fastening structure 20, and the target component 10.

Figure 4:
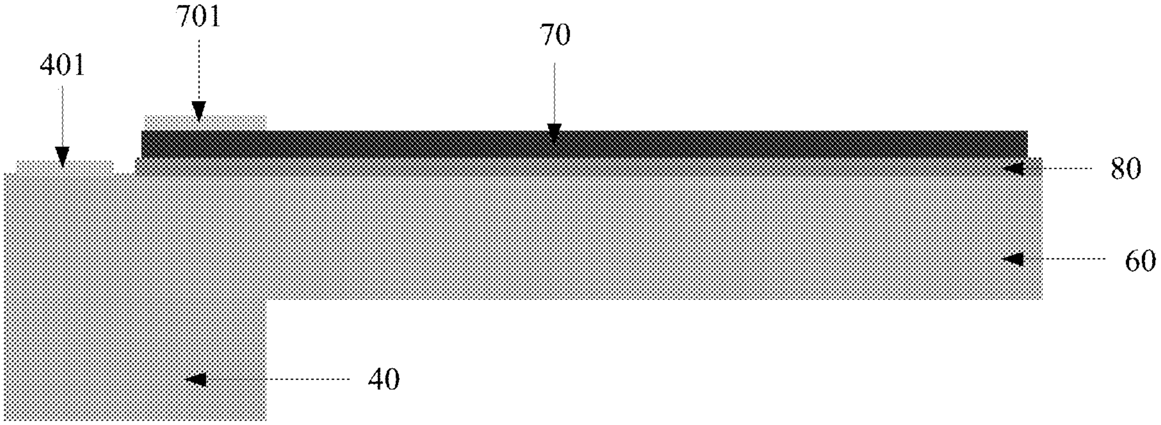
FIG. 4 is a fourth diagram of a structure of a temperature control apparatus according to an embodiment.

FIG. 4 is a fourth diagram of a structure of a temperature control apparatus according to an embodiment of this application. FIG. 4 shows a partial longitudinal section of the temperature control apparatus. In a possible implementation, for example, the temperature adjustment element 70 is a heating resistor and the heating resistor is disposed on the support beam 60. An electrode 701 is disposed on the heating resistor, and a voltage is loaded on the electrode 701 to control the heating resistor to perform heating. In some scenarios, for example, the target component 10 is a resonator. An electrode 401 is disposed on the fastening structure 40, and a voltage loaded on the electrode 401 may be conducted to the resonator through the support beam 60, the fastening frame 30, the support beam 60, and the fastening structure 20 in sequence. To avoid frequency drift of the resonator resulting from disturbance caused by a heating voltage loaded on the heating resistor to a bias voltage loaded on the resonator, a thermally conductive insulation layer 80 is disposed between the heating resistor and the support beam 60. The thermally conductive insulation layer 80 may implement heat conduction but is electrically isolated. Therefore, on the basis of ensuring that a temperature adjustment function is normal, the heating voltage loaded on the heating resistor is separated from the bias voltage loaded on the resonator, so that heating voltage resolution can be improved, to implement higher heating temperature resolution without affecting a function of the resonator.

In an implementation, the support beam 60, the temperature adjustment element 70, and the thermally conductive insulation layer 80 form a three-layer structure. Specifically, the support beam 60 is made of monocrystalline silicon, the thermally conductive insulation layer 80 is made of aluminum nitride (AlN), and the temperature adjustment element 70 is made of a semiconductor material. The semiconductor material includes but is not limited to amorphous silicon, polycrystalline silicon, germanium silicon, and the like. Theoretically, for a heating resistor made of a material whose resistivity is $\rho_e$ and whose thermal conductivity coefficient is 2, heating temperature resolution of the heating resistor is irrelevant to a structural design, and only complies with a formula $$dT = \frac{UdU}{\rho_e \lambda}.$$

U is a heating voltage, and dU is heating voltage resolution. In this application, the thermally conductive insulation layer is added, and a downward heat dissipation channel is provided, which increases an effective thermal conductivity coefficient $\lambda_{eff}$, and improves the heating temperature resolution. In addition, a multi-layer structure design allows the heating resistor to be excessively thin and a resistance value to be excessively large when it is ensured that structural rigidity remains unchanged. Therefore, based on a power consumption formula $$P = \frac{U^2}{R},$$

it can be learned that in this solution, power consumption can be reduced under a same temperature rise.

In conclusion, an advantage of a three-layer structure material provided in this implementation is that the downward heat dissipation channel is added for the heating resistor, which improves an effective heat dissipation coefficient. In addition, a resistance value of the heating resistor made of the semiconductor material is larger, which can effectively reduce power consumption. Compared with a solution in which the three-layer structure is entirely made of monocrystalline silicon and a solution in which the heating resistor is made of a metal material, this implementation has significant beneficial effect. The following further describes this implementation with reference to a simulation comparison diagram.

Figure 5:
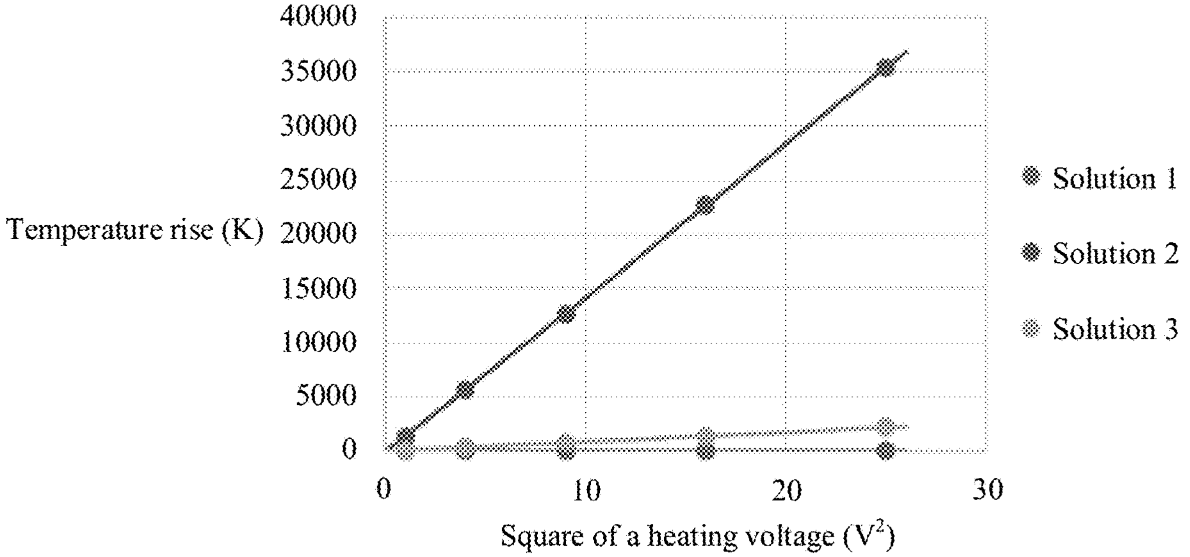
FIG. 5 is a simulation comparison diagram of heating solutions in which different materials are used.

FIG. 5 is a simulation comparison diagram of heating solutions in which different materials are used. As shown in FIG. 5, a solution 1 is the heating solution provided in the foregoing implementation, a solution 2 is the solution in which the heating resistor is made of the metal material, and a solution 3 is the solution in which the three-layer structure is entirely made of monocrystalline silicon. A temperature rise is a linear function of a square of a voltage, and conforms to a formula $\Delta T=kU^2$. A temperature rise K in the solution 2 is 1417 K/V$^2$, a temperature rise K in the solution 3 is 86.7 K/V$^2$, and a temperature rise K in the solution 1 is 1.9 K/V$^2$. It should be understood that a solution with a smaller slope in FIG. 5 has higher temperature adjustment precision. Under a specific temperature rise $\Delta T_0$ and a specific heating voltage resolution dU, heating temperature resolution $$dT = 2k\sqrt{\frac{\Delta T_0}{k}}\,dU.$$

It can be learned that a heating temperature resolution in the solution 1 provided in this application is approximately 27 times higher than that in the solution 2, and is approximately 7 times higher than that in the solution 3. Power consumption of the solution 1 provided in this application is approximately 800 times better than that of the solution 2, and is approximately 68 times better than that of the solution 3.

It should be understood that, in actual application, the three-layer structure may alternatively be made of another material. This is not specifically limited herein. For example, the temperature adjustment element 70 may alternatively be made of a conductor material.

Figure 6:
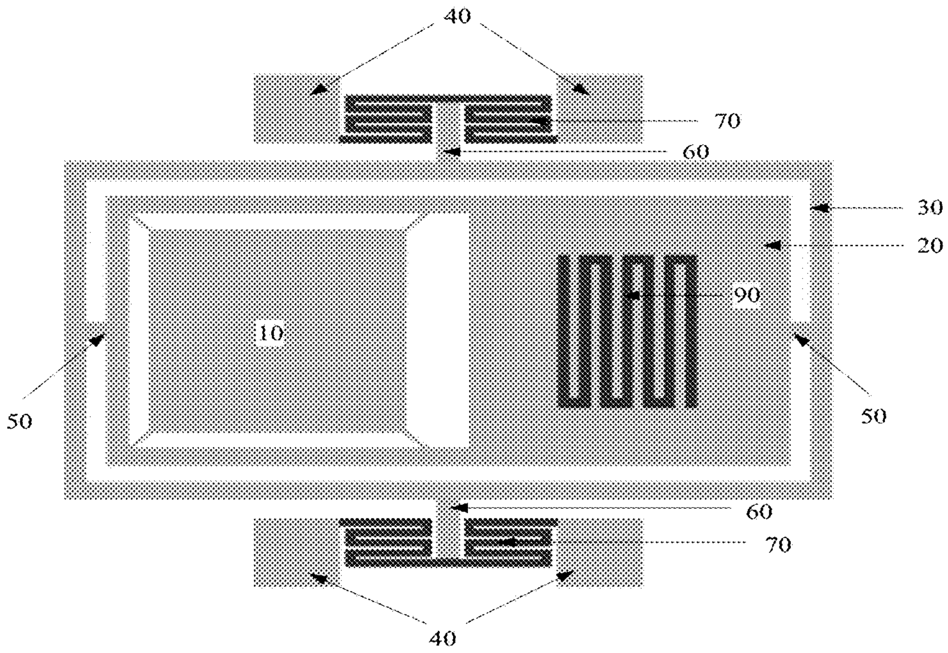
FIG. 6 is a fifth diagram of a structure of a temperature control apparatus according to an embodiment.

FIG. 6 is a fifth diagram of a structure of a temperature control apparatus according to an embodiment of this application. As shown in FIG. 6, in some possible implementations, the temperature control apparatus further includes a temperature measurement element 90. The temperature measurement element 90 is fastened to an inner side of the fastening frame 30 and is connected to the fastening structure 20. The temperature measurement element 90 is configured to detect a temperature of the target component 10. It should be understood that, because temperature gradient distribution introduced by an external environment mainly exists on the fastening frame 30, the target component 10 and the temperature measurement element 90 may maintain relatively balanced temperatures, and are slightly affected by an external ambient temperature, and temperature measurement precision is higher. It should be noted that a specific type of the temperature measurement element 90 is not limited in this application. For example, the temperature measurement element 90 may be a temperature measurement resistor, and a temperature value may be calibrated based on a resistance value by using sensitivity of the resistance value to a temperature.

It should be noted that, in a scenario in which the target component 10 is a resonator, temperature measurement may alternatively be implemented by using a temperature measurement working mode of the resonator, and the temperature measurement element does not need to be separately configured. In addition to the temperature measurement working mode, the resonator further has a clock working mode. For example, the temperature measurement working mode includes but is not limited to a square extensional (SE) working mode, and the clock working mode includes but is not limited to a Lamé mode. It should be understood that the resonator outputs signals at different frequencies in different working modes. In actual application, the resonator may work in any one of the working modes according to a requirement, or the resonator may work in the two working modes at the same time. The following describes in detail the two working modes of the resonator.

Figure 7:
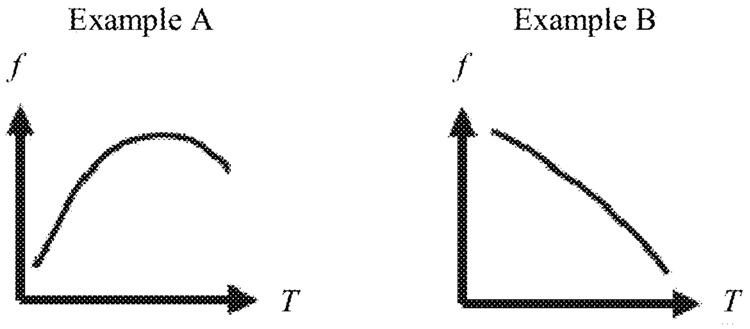
FIG. 7 is a diagram of two working modes of a resonator according to an embodiment.

FIG. 7 is a diagram of two working modes of a resonator according to an embodiment of this application. As shown in Example A in FIG. 7, a frequency of a signal output by the resonator in a clock working mode has an inflection point relative to a temperature change, and a frequency near the inflection point almost does not change with the temperature change. Therefore, the resonator may provide stable clock signal output within a temperature range near the inflection point. As shown in Example B in FIG. 7, a frequency of a signal output by the resonator in a temperature measurement working mode changes with a temperature and has no inflection point. Therefore, the temperature may be calibrated based on the frequency of the signal output in the temperature measurement working mode. For example, a correspondence between a frequency and a temperature may be preconfigured, to determine a current temperature of the resonator based on the correspondence and the frequency of the signal output by the resonator in the temperature measurement working mode.

In actual application, the resonator may output a clock signal at a stable frequency based on the two working modes of the resonator and in cooperation with a temperature adjustment element. Specifically, a temperature may be first calibrated based on a frequency of a signal output in the temperature measurement working mode, and then the temperature adjustment element is controlled to adjust a temperature of the resonator based on the detected temperature, so as to control the temperature of the resonator within a target range. In this way, it can be ensured that the resonator outputs the clock signal at a stable frequency. The target range is a temperature range near an inflection point in the clock working mode. The target range is subject to actual application, and is not limited herein.

In some possible implementations, the temperature control apparatus may alternatively include two resonators, and the two resonators work in different working modes. Same effect may also be achieved through cooperation of the two resonators, which extends application scenarios of this solution. The following provides several specific implementations in which the two resonators are used.

Figure 8A:
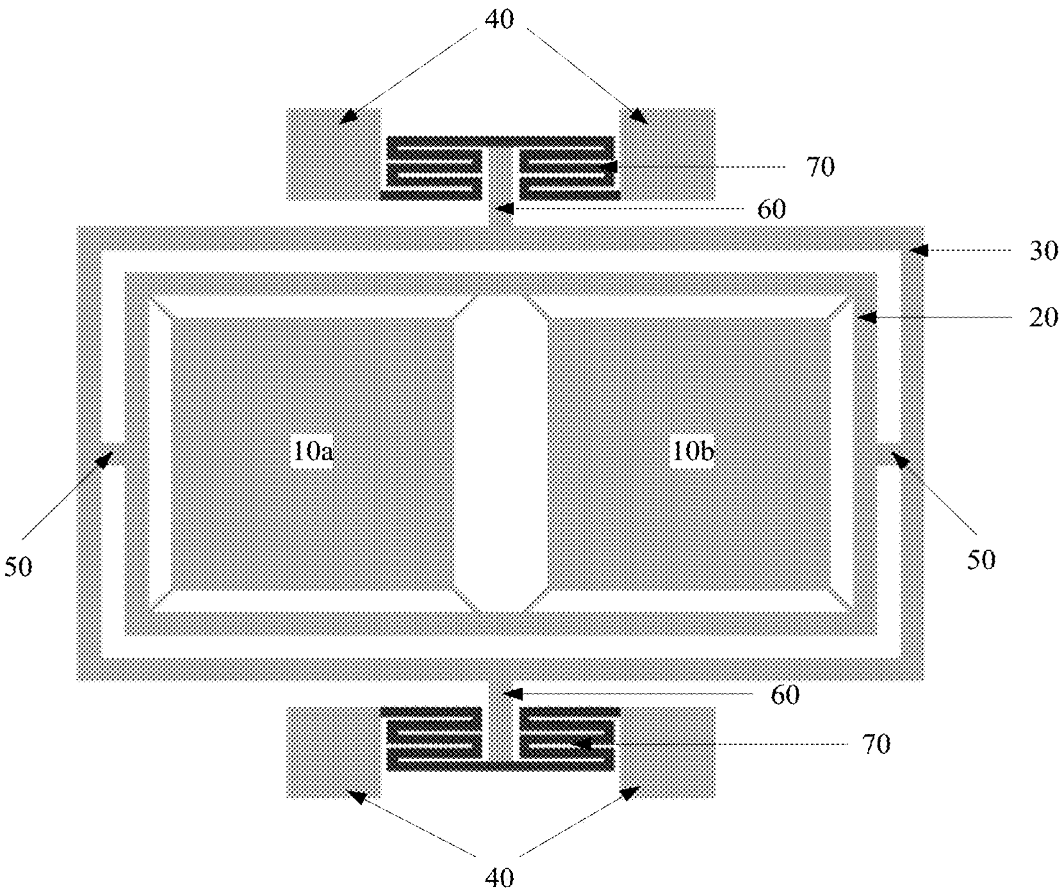
FIG. 8A is a sixth diagram of a structure of a temperature control apparatus according to an embodiment.

FIG. 8A is a sixth diagram of a structure of a temperature control apparatus according to an embodiment of this application. As shown in FIG. 8A, both a resonator 10*a* and a resonator 10*b* are fastened to the fastening structure 20. In an example, the resonator 10*a* is in a clock working mode, and the resonator 10*b* is in a temperature measurement working mode. In another example, the resonator 10*a* is in a temperature measurement working mode, and the resonator 10*b* is in a clock working mode.

Figure 8B:
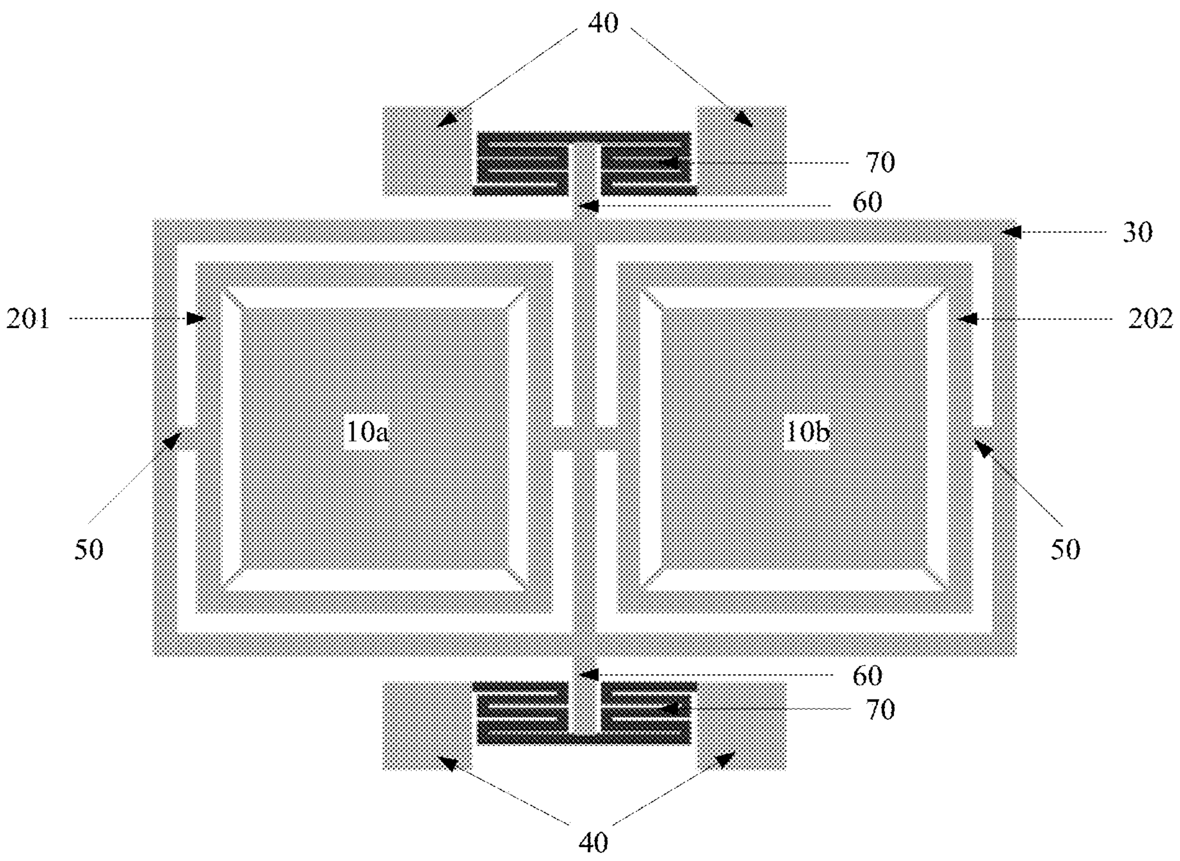
FIG. 8B is a seventh diagram of a structure of a temperature control apparatus according to an embodiment.

FIG. 8B is a seventh diagram of a structure of a temperature control apparatus according to an embodiment of this application. Different from the structure shown in FIG. 8A, as shown in FIG. 8B, the fastening structure 20 includes a fastening structure 201 and a fastening structure 202. The resonator 10*a* is fastened to the fastening structure 201, and the resonator 10*b* is fastened to the fastening structure 202. It can be learned by comparing the structures shown in FIG. 8A and FIG. 8B that, in the structure shown in FIG. 8A, the fastening structure 201 and the fastening structure 202 are integrated into one fastening structure 20, which can enhance thermal coupling between the resonator 10*a* and the resonator 10*b*, and is conductive to improving temperature measurement precision. In the structure shown in FIG. 8B, a connection rod is added between the fastening structure 201 and the fastening structure 202. The structure shown in FIG. 8B is different from the structure shown in FIG. 8A in that structural rigidity is improved, and reliability of the overall structure is enhanced.

Figure 8C:
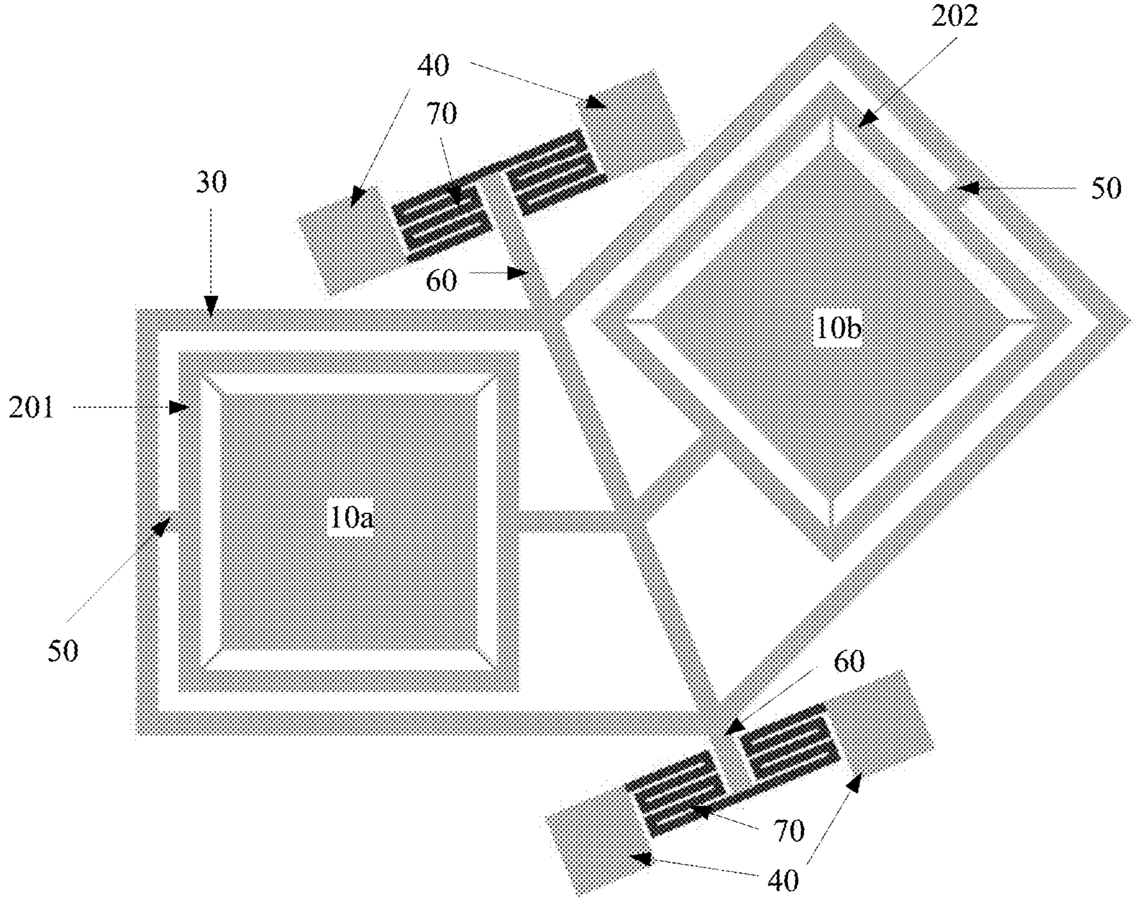
FIG. 8C is an eighth diagram of a structure of a temperature control apparatus according to an embodiment.

FIG. 8C is an eighth diagram of a structure of a temperature control apparatus according to an embodiment of this application. Different from the structure shown in FIG. 8B, as shown in FIG. 8C, any angle may be formed between the resonator 10*a* and the resonator 10*b*, and the resonator 10*a* and the resonator 10*b* are not necessarily placed in parallel, which extends application scenarios of the dual resonators. In a possible scenario, the resonator 10*a* works in a clock working mode with a crystal orientation of 100, and the resonator 10*b* works in a temperature measurement working mode with a crystal orientation of 110. In this case, an eigenfrequency of the temperature measurement working mode is excessively sensitive to a temperature, and supports high-precision temperature measurement.

Figure 8D:
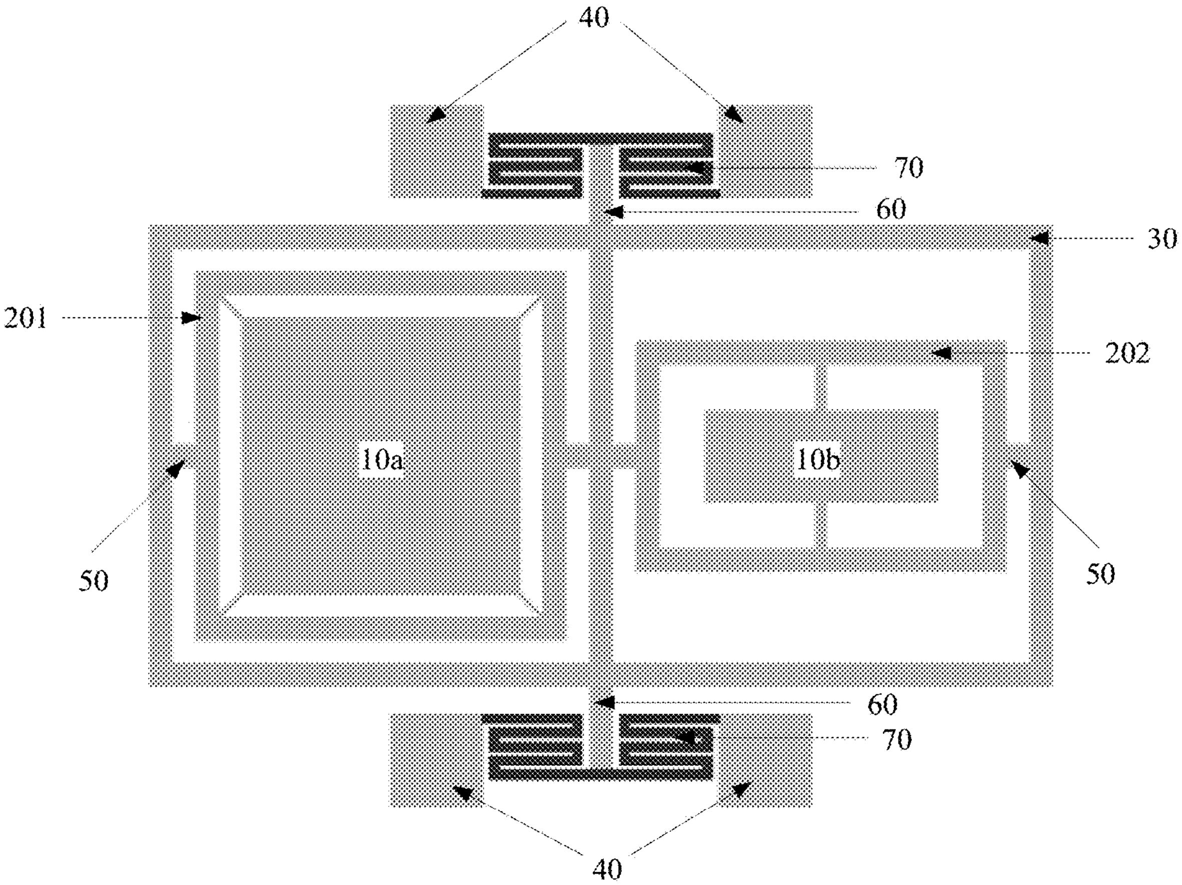
FIG. 8D is a ninth diagram of a structure of a temperature control apparatus according to an embodiment.

FIG. 8D is a ninth diagram of a structure of a temperature control apparatus according to an embodiment of this application. As shown in FIG. 8D, the resonator 10*a* and the resonator 10*b* may alternatively have different forms, to adapt to different working modes. For example, the resonator 10*a* is of a square structure, and the resonator 10*b* is of a rectangular structure. The resonator 10*a* may be used in a Lamé mode or an SE working mode. The resonator 10*b* may be used in a length extensional (LE) working mode.

In some possible implementations, on the basis of the foregoing double-layer structure, the foregoing temperature control apparatus may be further extended to a structure of more layers. After isolation of a multi-layer structure, temperature uniformity on the target component 10 can be better maintained. The following uses an example in which the foregoing temperature control apparatus is extended to a three-layer structure for description.

Figure 9:
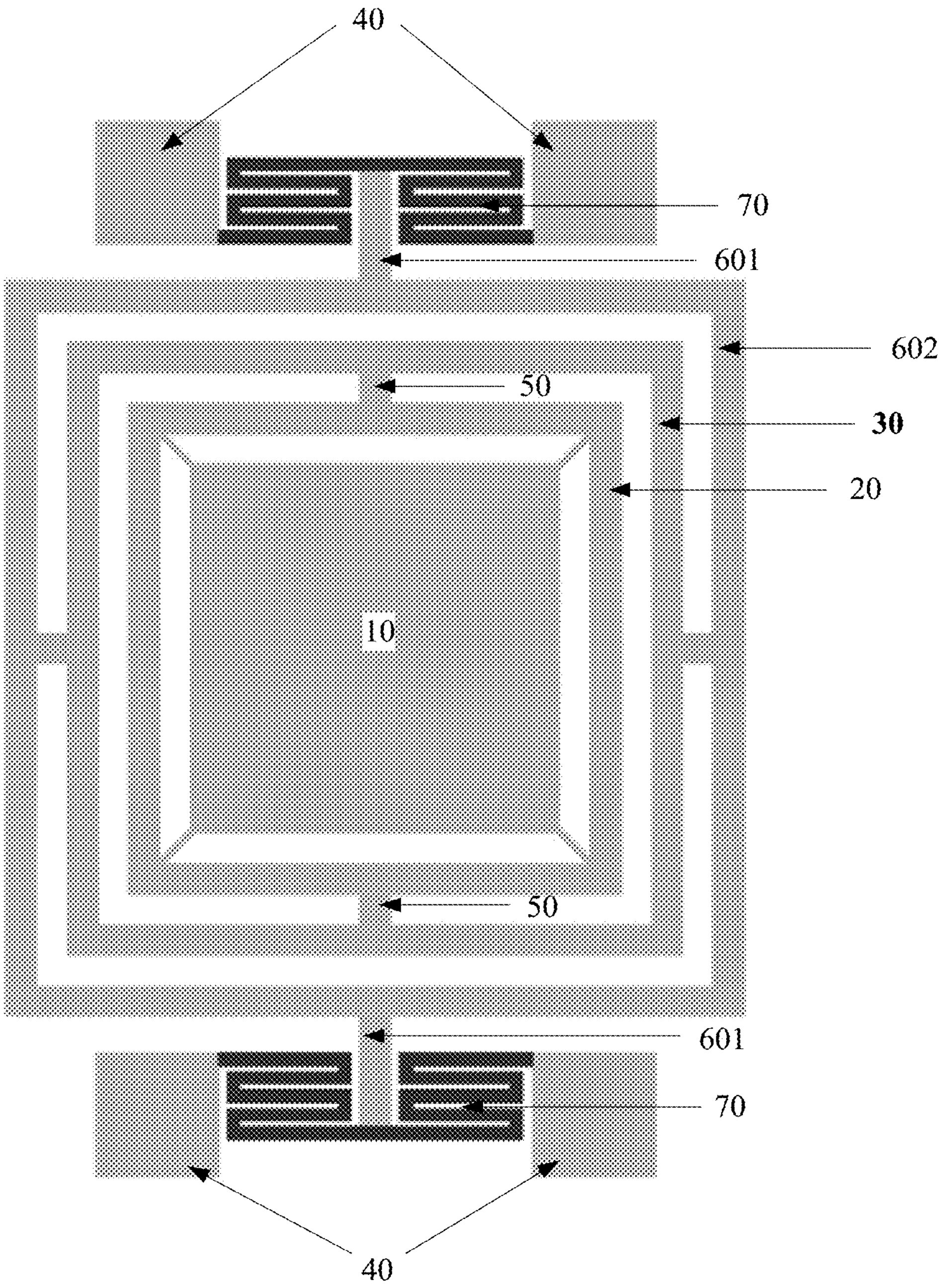
FIG. 9 is a tenth diagram of a structure of a temperature control apparatus according to an embodiment.

FIG. 9 is a tenth diagram of a structure of a temperature control apparatus according to an embodiment of this application. As shown in FIG. 9, the support beam 60 includes a connection beam 601 and a connection frame 602. The fastening frame 30 is located on an inner side of the connection frame 602 and is connected to the connection frame 602. One end of the connection beam 601 is connected to the fastening structure 40, and the other end of the connection beam 601 is connected to the connection frame 602. It should be understood that the connection frame 602 may be considered as an outer layer structure, the fastening frame 30 may be considered as an intermediate layer structure, and the fastening structure 20 may be considered as an inner layer structure, to form a three-layer thermal isolation structure. It should be understood that two connection positions between every two adjacent layers of structures in the three-layer structure are isothermal. For example, two positions that are on the fastening frame 30 and that are for connection to the fastening structure 20 are isothermal, and two positions that are on the connection frame 602 and that are for connection to the fastening frame 30 are also isothermal. Based on the structure shown in FIG. 9, the temperature control apparatus may be further extended to a structure of more layers in a similar manner. A specific manner is not described herein again.

In a scenario in which the target component 10 is a resonator, both a MEMS resonator and a crystal MEMS resonator may be directly used in any one of the foregoing embodiments. The MEMS resonator and the crystal MEMS resonator may usually be connected to the fastening structure 20 through a connection rod. For a crystal resonator, due to different manufacturing technologies, the crystal resonator is usually bonded to the fastening structure 20. Except that, other features are similar to those in the foregoing embodiments, and details are not described herein again. The following provides some accompanying drawings to show implementations of using the crystal resonator in the foregoing temperature control apparatus.

Figure 10A:
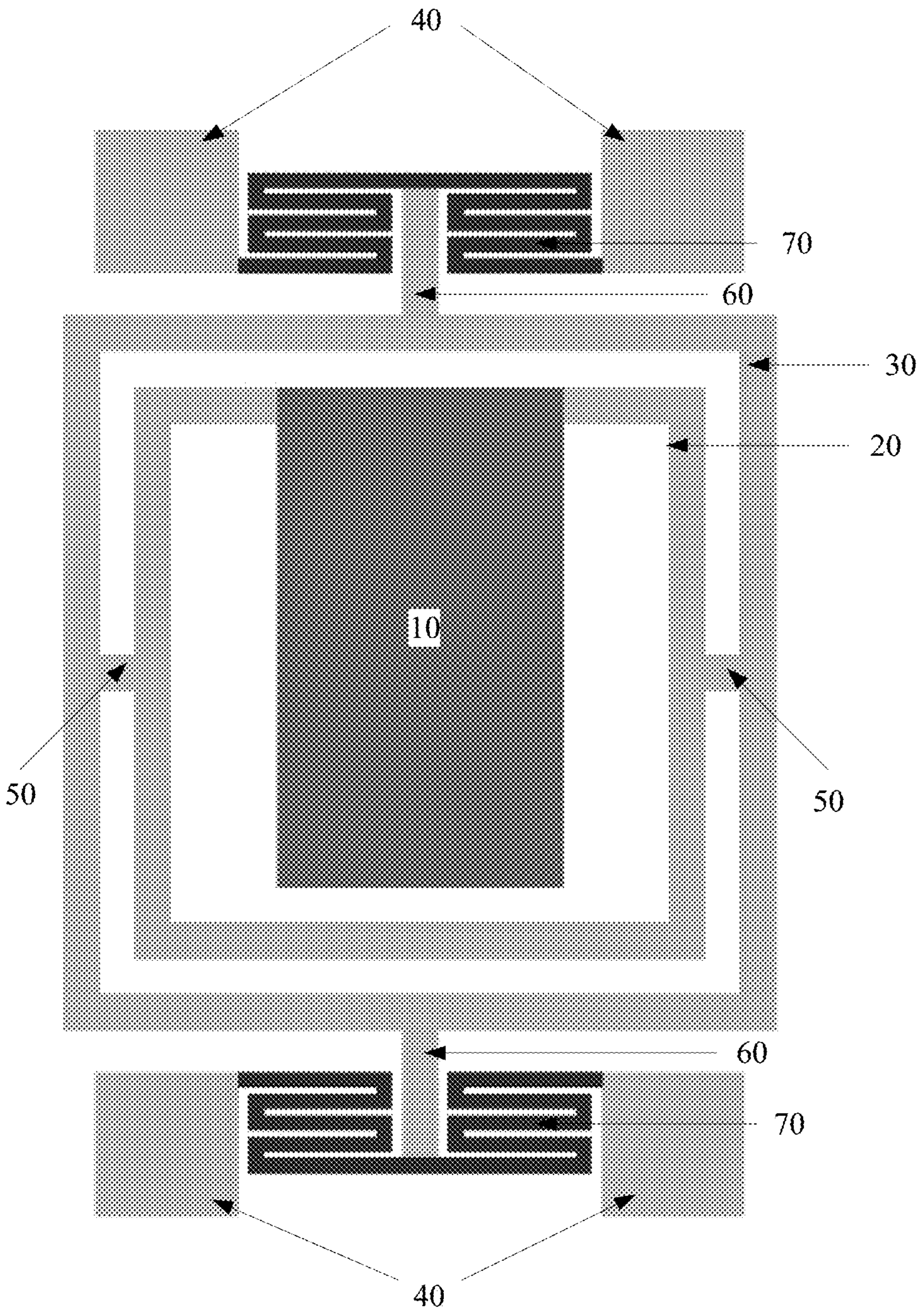
FIG. 10A is an eleventh diagram of a structure of a temperature control apparatus according to an embodiment.
Figure 10B:
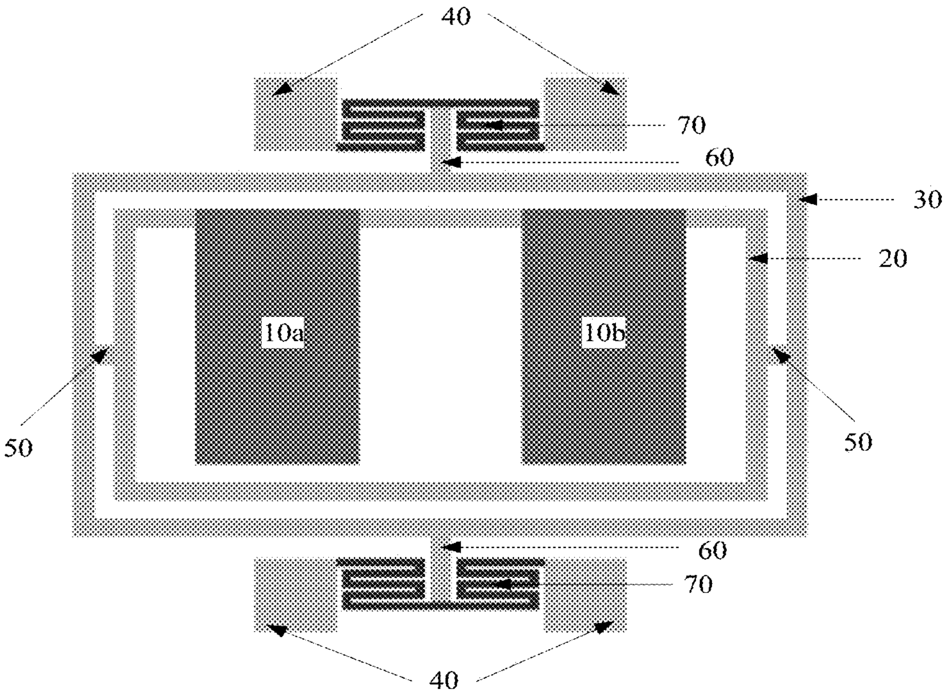
FIG. 10B is a twelfth diagram of a structure of a temperature control apparatus according to an embodiment.
Figure 10C:
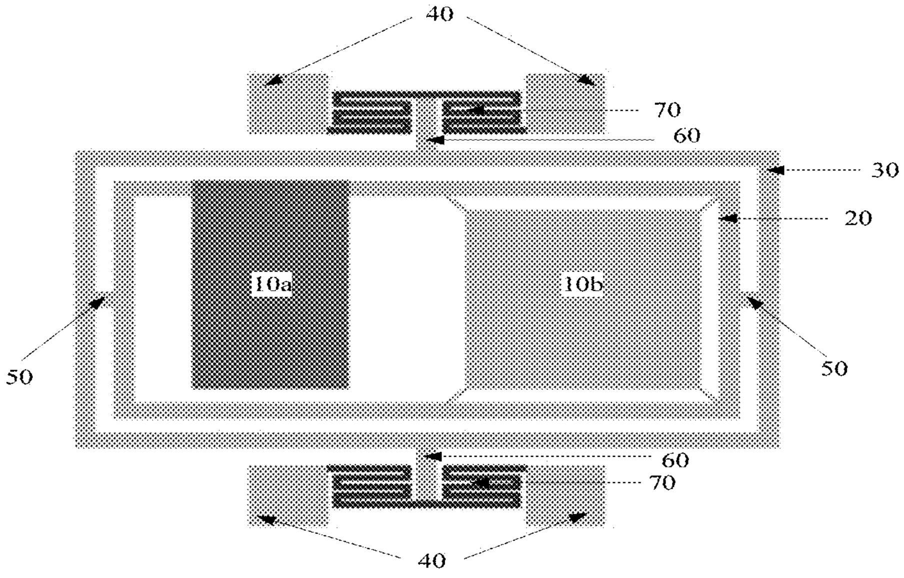
FIG. 10C is a thirteenth diagram of a structure of a temperature control apparatus according to an embodiment.
Figure 10D:
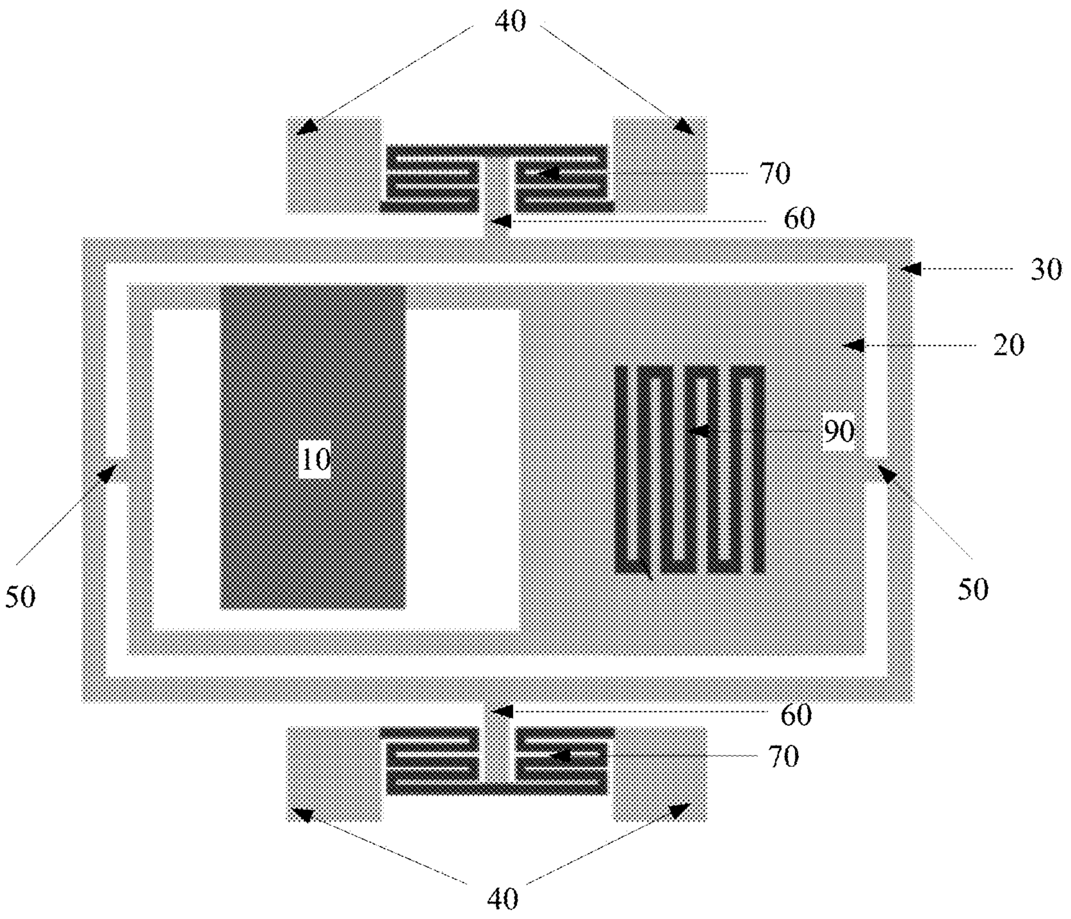
FIG. 10D is a fourteenth diagram of a structure of a temperature control apparatus according to an embodiment.

FIG. 10A is an eleventh diagram of a structure of a temperature control apparatus according to an embodiment of this application. As shown in FIG. 10A, a target component 10, which may be a crystal resonator, is bonded to the fastening structure 20. FIG. 10B is a twelfth diagram of a structure of a temperature control apparatus according to an embodiment of this application. As shown in FIG. 10B, the temperature control apparatus includes a crystal resonator 10*a* and a crystal resonator 10*b*, and both the crystal resonator 10*a* and the crystal resonator 10*b* are bonded to the fastening structure 20. FIG. 10C is a thirteenth diagram of a structure of a temperature control apparatus according to an embodiment of this application. As shown in FIG. 10C, the temperature control apparatus includes the crystal resonator 10*a* and a MEMS resonator 10*b*. The crystal resonator 10*a* is bonded to the fastening structure 20, and the MEMS resonator 10*b* is connected to the fastening structure 20 through a connection rod. In this solution, both a feature of small frequency drift of the crystal resonator 10*a* resulting from temperature drift and a feature of large frequency drift of the MEMS resonator 10*b* resulting from temperature drift are used. The crystal resonator 10*a* is used as a clock to reduce frequency drift resulting from temperature drift, and the MEMS resonator 10*b* is used as a temperature measurement sensor to improve temperature measurement sensitivity, which improves frequency temperature stability of an output clock signal. FIG. 10D is a fourteenth diagram of a structure of a temperature control apparatus according to an embodiment of this application. As shown in FIG. 10D, the temperature control apparatus further includes a temperature measurement element 90, and the temperature measurement element 90 may be configured to detect a temperature of the target component 10, which may be a crystal resonator.

In some possible implementations, the temperature control apparatus may be formed through processing of silicon-on-insulator (SOI). The temperature control apparatus includes a component layer, an insulation layer, and a substrate layer, and the insulation layer is located between the component layer and the substrate layer. It should be understood that materials of the component layer and the substrate layer include but are not limited to silicon, polycrystalline silicon, and silicon carbide, and materials of the insulation layer include but are not limited to silicon dioxide and silicon nitride. For different types of resonators, specific processing manners may also be different, which are separately described below.

In an example, a MEMS resonator, the fastening structure 20, the fastening frame 30, and the fastening structure 40 are all located at the component layer, and the fastening structure 40 is fastened to the substrate layer. A hollow area may be designed on the substrate layer, and the MEMS resonator, the fastening structure 20, and the fastening frame 30 may all be suspended on the hollow area. It should be understood that this example is mainly applicable to a scenario of the MEMS resonator.

In another example, if a crystal resonator is used, a part of each of the fastening structure 20, the fastening frame 30, and the fastening structure 40 is located at the substrate layer. That is, this example is different from the foregoing example in which the MEMS resonator is used in that the substrate layer is further used to manufacture the fastening structure 20, the fastening frame 30, and the fastening structure 40. Further, the fastening structure 40 is configured to be fastened to a base, so that the crystal resonator, the fastening structure 20, and the fastening frame 30 are in a suspended state. It should be understood that, in some possible scenarios, the fastening structure 40 may be fastened to a package tube shell. It should be understood that a specific design manner of the component layer is not limited in this example, and this example may be applicable to scenarios of the MEMS resonator and the crystal resonator.

Based on the foregoing description of the temperature control apparatus, it can be learned that this application provides a double-layer structure design to isolate a target component from an external environment, so as to achieve better thermal isolation effect. A fastening frame located at an outer layer is directly in contact with the external environment, and temperature gradient distribution introduced by the external environment mainly exists on the fastening frame. A fastening structure located at an inner layer is connected to the fastening frame through two support beams. A temperature difference between two positions that are on the fastening frame and that are respectively for connection to the two support beams is less than a first preset value. In other words, the fastening structure is connected to the two isothermal positions on the fastening frame. Therefore, the fastening structure is heated more uniformly. In this way, the fastening structure and the target component connected to the fastening structure can maintain relatively balanced temperatures, and impact of external ambient temperature fluctuation on the target component is reduced, so that temperature measurement precision is improved.

The foregoing describes the temperature control apparatus provided in this application. If the target component is a resonator, the temperature control apparatus may be further used in a scenario of an oscillator. The oscillator includes an oven-controlled oscillator and a temperature-compensated oscillator. Specifically, the oven-controlled oscillator may be an OCMO using a MEMS resonator, or may be an oven-controlled crystal oscillator (OCXO) using a crystal resonator. The temperature-compensated oscillator may be a temperature-compensated MEMS oscillator (TCMO) using a MEMS resonator, or may be a temperature-compensated crystal oscillator (TCXO) using a crystal resonator. It should be understood that the oven-controlled oscillator provides a clock signal at a stable frequency through active temperature adjustment. The temperature-compensated oscillator algorithmically compensates for, by using a temperature compensation module, frequency drift resulting from temperature drift, to implement a clock signal at a stable frequency.

The following separately describes specific implementations of the oven-controlled oscillator and the temperature-compensated oscillator.

Figure 11:
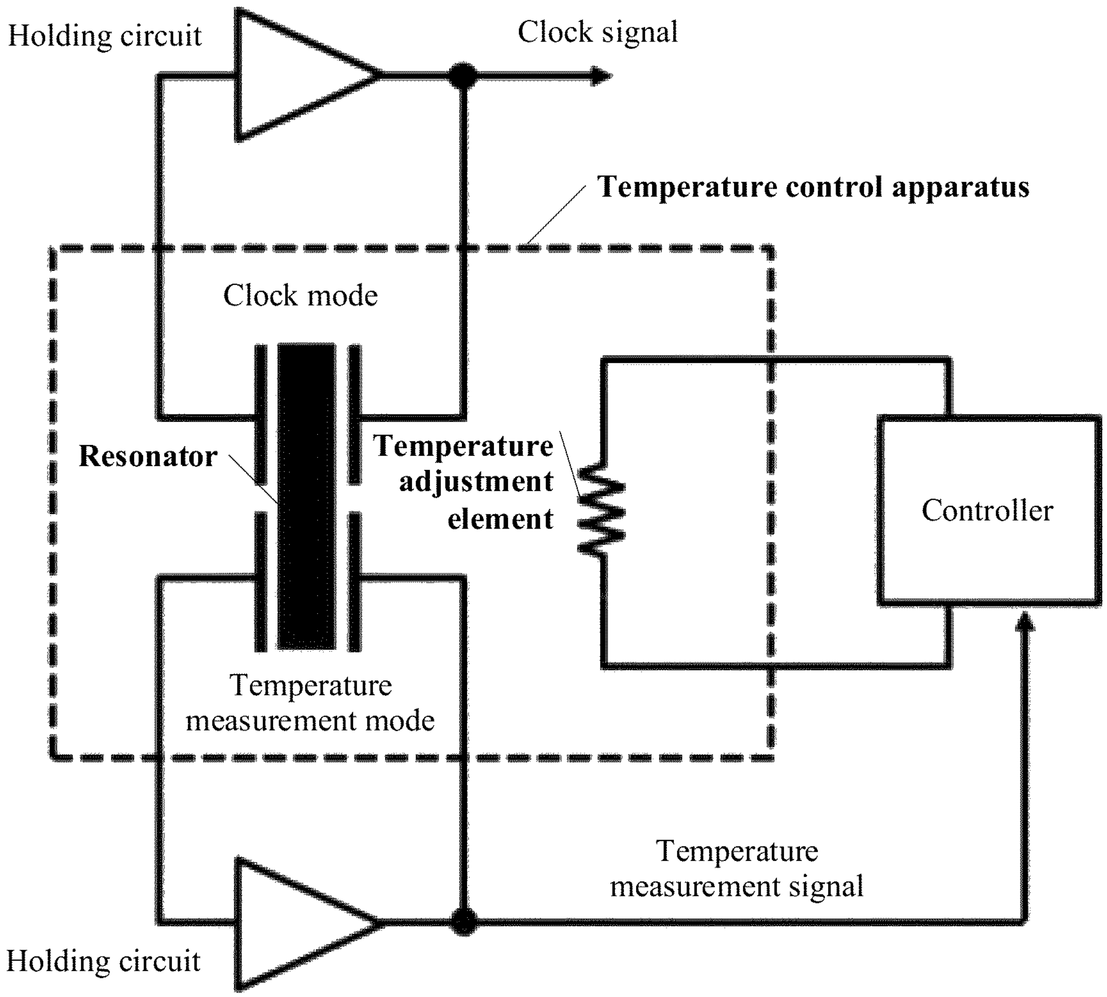
FIG. 11 is a diagram of a structure of an oven-controlled oscillator according to an embodiment.

FIG. 11 is a diagram of a structure of an oven-controlled oscillator according to an embodiment of this application. As shown in FIG. 11, the oven-controlled oscillator includes a controller and a temperature control apparatus. A target component in the temperature control apparatus is a resonator, and the temperature control apparatus includes a temperature adjustment element. For other features of the temperature control apparatus, refer to related descriptions in any one of the foregoing embodiments, and details are not described herein again. It should be understood that the controller may obtain an original temperature of the resonator, and the original temperature may be understood as a currently detected temperature of the resonator. In this way, the controller controls the temperature adjustment element based on the original temperature to adjust the original temperature to a target temperature, so that the resonator can output a clock signal at a stable frequency in a clock working mode. Refer to Example A shown in FIG. 7. The target temperature is in a temperature range near an inflection point, and a frequency near the inflection point almost does not change with a temperature, which ensures that the resonator can output the clock signal at a stable frequency.

In a possible implementation, as shown in FIG. 11, the resonator outputs a temperature measurement signal to the controller in a temperature measurement working mode, and the controller specifically determines the original temperature of the resonator based on the temperature measurement signal. Refer to Example B shown in FIG. 7. A frequency of a signal output by the resonator in the temperature measurement working mode changes with a temperature and has no inflection point. Therefore, the temperature may be calibrated based on the frequency of the signal output in the temperature measurement working mode.

In another possible implementation, the temperature control apparatus may further include a temperature measurement element (not shown in the accompanying drawing herein), and the temperature measurement element detects the original temperature of the resonator and feeds back the original temperature to the controller.

Figure 12:
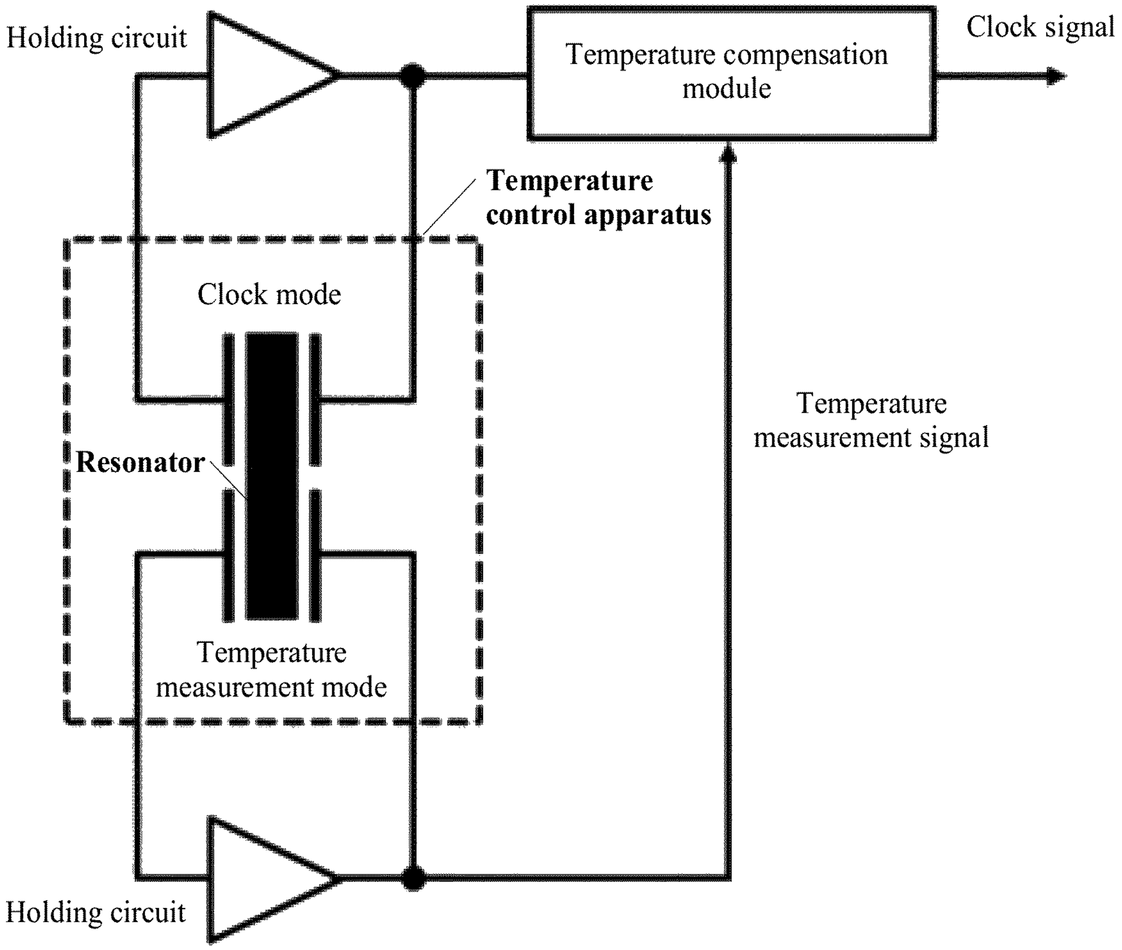
FIG. 12 is a diagram of a structure of a temperature-compensated oscillator according to an embodiment.

FIG. 12 is a diagram of a structure of a temperature-compensated oscillator according to an embodiment of this application. As shown in FIG. 12, the temperature-compensated oscillator includes a temperature compensation module and a temperature control apparatus. A target component in the temperature control apparatus is a resonator. Different from that in the oven-controlled oscillator shown in FIG. 11, the temperature control apparatus in this embodiment does not need to be disposed with a temperature adjustment element. For other features of the temperature control apparatus, refer to related descriptions in any one of the foregoing embodiments, and details are not described herein again. It should be understood that the resonator is configured to output an original clock signal to the temperature compensation module. The temperature compensation module obtains a temperature of the resonator, and adjusts the original clock signal based on the temperature to obtain a target clock signal at a stable frequency.

In a possible implementation, as shown in FIG. 12, the resonator outputs a temperature measurement signal to the temperature compensation module in a temperature measurement working mode, and the temperature compensation module specifically determines the temperature of the resonator based on the temperature measurement signal. Refer to Example B shown in FIG. 7. A frequency of a signal output by the resonator in the temperature measurement working mode changes with a temperature and has no inflection point. Therefore, the temperature may be calibrated based on the frequency of the signal output in the temperature measurement working mode.

In another possible implementation, the temperature control apparatus may further include a temperature measurement element (not shown in the accompanying drawing herein), and the temperature measurement element detects the temperature of the resonator and feeds back the temperature to the temperature compensation module.

It should be understood that, the temperature control apparatus of a double-layer design provided in this application ensures that the resonator is in a state of high temperature uniformity. Therefore, a temperature difference sensed between the temperature measurement working mode and the clock working mode of the resonator is small. Therefore, in the temperature measurement working mode, a temperature of the clock working mode may be measured with high precision, which helps the resonator output a clock signal at a more stable frequency.

It should be noted that the foregoing embodiments are only used to describe the technical solutions of this application, but not to limit the technical solutions. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and the scope of the technical solutions of the embodiments of this application.

The invention claimed is:

1. A temperature control apparatus comprising:
- a fastening frame comprising:
  - a first inner side;
  - an outer side;
  - a first connection position; and
  - a second connection position;
- a first support beam connected to the first connection position;
- a second support beam connected to the second connection position, wherein a temperature difference between the first connection position and the second connection position is less than a first preset value, and wherein the second support beam comprises:
  - a connection frame comprising:
    - a second inner side;
    - a third connection position; and
    - a fourth connection position, wherein the fastening frame is disposed on the second inner side and is connected to the connection frame via the third connection position and the fourth connection position, and wherein a temperature difference between the third connection position and the fourth connection position is less than the first preset value; and
  - a connection beam comprising:
    - a first end; and
    - a second end connected to the connection frame;
- a first fastening structure disposed on the first inner side and connected to the fastening frame via the first support beam and the second support beam;
- a target component disposed on the first inner side and fastened to the first fastening structure;
- a third support beam;
- a fourth support beam; and
- a second fastening structure connected to the first end and disposed on the outer side and connected to the fastening frame via the third support beam and the fourth support beam.

2. The temperature control apparatus of claim 1, wherein the fastening frame further comprises:
- a fifth connection position connected to the third support beam;
- a sixth connection position connected to the fourth support beam;
- a first sub-area disposed between the first connection position and the fifth connection position;
- a second sub-area disposed between the second connection position and the fifth connection position;
- a third sub-area disposed between the first connection position and the sixth connection position; and
- a fourth sub-area disposed between the second connection position and the sixth connection position, wherein a difference between a first ratio of a thermal resistance of the first sub-area to a thermal resistance of the third sub-area and a second ratio of a thermal resistance of the second sub-area to a thermal resistance of the fourth sub-area is less than a second preset value.

3. The temperature control apparatus of claim 1, further comprising a temperature adjustment element configured to adjust temperatures of the fastening frame, the first fastening structure, and the target component.

4. The temperature control apparatus of claim 3, further comprising a thermally conductive insulation layer, wherein the temperature adjustment element is disposed on at least one of the first support beam or the third support beam, and wherein the thermally conductive insulation layer is disposed between the temperature adjustment element and the at least one of the first support beam or the third support beam.

5. The temperature control apparatus of claim 4, wherein a first voltage is applied to the temperature adjustment element to perform heating, wherein a second voltage applied to at least one of the first support beam or the third support beam is conducted to the target component, and wherein the first voltage is electrically isolated from the second voltage.

6. The temperature control apparatus of claim 1, further comprising a temperature measurement element disposed on the first inner side and fastened to the first fastening structure, wherein the temperature measurement element is configured to detect a temperature of the target component.

7. The temperature control apparatus of claim 1, wherein the target component is a first resonator comprising:

a clock working mode; and a temperature measurement working mode, wherein when the first resonator is in the clock working mode and a temperature of the first resonator is within a target range, the first resonator outputs a clock signal at a stable frequency, and wherein when the first resonator is in the temperature measurement working mode, a temperature measurement signal output by the first resonator indicates a temperature of the first resonator.

8. The temperature control apparatus of claim 1, wherein the temperature control apparatus further comprises a second resonator disposed on the first inner side and fastened to the first fastening structure, and wherein the target component is a third resonator, the third resonator is in a clock working mode, and the second resonator is in a temperature measurement working mode, or wherein the third resonator is in the temperature measurement working mode, and the second resonator is in the clock working mode.

9. The temperature control apparatus of claim 1, further comprising a substrate layer fastened to the second fastening structure, wherein the fastening frame, the first fastening structure, and the target component are suspended on the substrate layer.

10. The temperature control apparatus of claim 1, further comprising:

a substrate layer, wherein a partial structure of each of the first fastening structure, the second fastening structure, and the fastening frame is disposed on the substrate layer; and a base fastened to the second fastening structure, wherein the fastening frame, the first fastening structure, and the target component are suspended on the base.

11. A temperature-compensated oscillator comprising:

a temperature control apparatus comprising:

a fastening frame comprising:

a first inner side;

an outer side;

a first connection position; and a second connection position;

a first support beam connected to the first connection position;

a second support beam connected to the second connection position, wherein a temperature difference between the first connection position and the second connection position is less than a first preset value, and wherein the second support beam comprises:

a connection frame comprising:

a second inner side;

a third connection position; and a fourth connection position, wherein the fastening frame is disposed on the second inner side and is connected to the connection frame via the third connection position and the fourth connection position, and wherein a temperature difference between the third connection position and the fourth connection position is less than the first preset value; and a connection beam comprising:

a first end; and a second end connected to the connection frame;

a first fastening structure disposed on the first inner side and connected to the fastening frame via the first support beam and the second support beam;

a target component disposed on the first inner side and fastened to the first fastening structure;

a third support beam;

a fourth support beam; and a second fastening structure connected to the first end and disposed on the outer side and connected to the fastening frame via the third support beam and the fourth support beam; and a temperature compensation module configured to:

obtain a temperature of the target component, wherein the target component is configured to output an original clock signal to the temperature compensation module; and adjust the original clock signal based on the temperature to obtain a target clock signal at a stable frequency.

12. The temperature-compensated oscillator of claim 11, wherein the fastening frame further comprises:

a fifth connection position connected to the third support beam;

a sixth connection position connected to the fourth support beam;

a first sub-area disposed between the first connection position and the fifth connection position;

a second sub-area disposed between the second connection position and the fifth connection position;

a third sub-area disposed between the first connection position and the sixth connection position; and a fourth sub-area disposed between the second connection position and the sixth connection position, wherein a difference between a first ratio of a thermal resistance of the first sub-area to a thermal resistance of the third sub-area and a second ratio of a thermal resistance of the second sub-area to a thermal resistance of the fourth sub-area is less than a second preset value.

13. The temperature-compensated oscillator of claim 11, wherein the temperature control apparatus further comprises a temperature adjustment element configured to adjust temperatures of the fastening frame, the first fastening structure, and the target component.

14. The temperature-compensated oscillator of claim 11, wherein the target component is further configured to output a temperature measurement signal to the temperature compensation module, and wherein the temperature compensation module is further configured to obtain the temperature of the target component based on the temperature measurement signal.

15. The temperature-compensated oscillator of claim 11, wherein the temperature control apparatus further comprises a temperature measurement element configured to detect the temperature of the target component, and wherein the temperature compensation module is further configured to obtain the temperature of the target component by using the temperature measurement element.

16. An oven-controlled oscillator comprising:

a temperature control apparatus comprising:

a fastening frame comprising:

a first inner side;

an outer side;

a first connection position; and
a second connection position;
a first support beam connected to the first connection position;
a second support beam connected to the second connection position, wherein a temperature difference between the first connection position and the second connection position is less than a first preset value, and wherein the second support beam comprises:
a connection frame comprising:
a second inner side;
a third connection position; and
a fourth connection position, wherein the fastening frame is disposed on the second inner side and is connected to the connection frame via the third connection position and the fourth connection position, and wherein a temperature difference between the third connection position and the fourth connection position is less than the first preset value; and
a connection beam comprising:
a first end connected to the second fastening structure; and
a second end connected to the connection frame;
a first fastening structure disposed on the first inner side and connected to the fastening frame via the first support beam and the second support beam;
a target component disposed on the first inner side and fastened to the first fastening structure;
a third support beam;
a fourth support beam;
a second fastening structure disposed on the outer side and connected to the fastening frame via the third support beam and the fourth support beam; and
a temperature adjustment element; and
a controller configured to:
obtain an original temperature of the target component; and
control the temperature adjustment element based on the original temperature to adjust the original temperature to a target temperature, wherein when the target component is in a clock working mode and the target component is at the target temperature, the target component outputs a clock signal at a stable frequency.

17. The oven-controlled oscillator of claim 16, wherein the fastening frame further comprises:
a fifth connection position connected to the third support beam;
a sixth connection position connected to the fourth support beam;
a first sub-area disposed between the first connection position and the fifth connection position;
a second sub-area disposed between the second connection position and the fifth connection position;
a third sub-area disposed between the first connection position and the sixth connection position; and
a fourth sub-area disposed between the second connection position and the sixth connection position, wherein a difference between a first ratio of a thermal resistance of the first sub-area to a thermal resistance of the third sub-area and a second ratio of a thermal resistance of the second sub-area to a thermal resistance of the fourth sub-area is less than a second preset value.

18. The oven-controlled oscillator of claim 16, wherein the target component is configured to output a temperature measurement signal to the controller, and wherein the controller is further configured to obtain the original temperature of the target component based on the temperature measurement signal.

19. The oven-controlled oscillator of claim 16, wherein the temperature control apparatus further comprises a temperature measurement element configured to detect the original temperature of the target component, and wherein the controller is further configured to obtain the original temperature of the target component by using the temperature measurement element.

20. The temperature-compensated oscillator of claim 11, wherein the temperature control apparatus further comprises a substrate layer fastened to the second fastening structure, wherein the fastening frame, the first fastening structure, and the target component are suspended on the substrate layer.

* * * * *